(12) United States Patent
Steensgaard-Madsen

(10) Patent No.: US 8,502,594 B2
(45) Date of Patent: Aug. 6, 2013

(54) BOOTSTRAP TRANSISTOR CIRCUIT

(75) Inventor: Jesper Steensgaard-Madsen, San Jose, CA (US)

(73) Assignee: Linear Technology Corporation, Milpitas, CA (US)

( * ) Notice: Subject to any disclaimer, the term of this patent is extended or adjusted under 35 U.S.C. 154(b) by 314 days.

(21) Appl. No.: 12/628,945

(22) Filed: Dec. 1, 2009

(65) Prior Publication Data

US 2010/0164597 A1 Jul. 1, 2010

Related U.S. Application Data

(60) Provisional application No. 61/141,787, filed on Dec. 31, 2008.

(51) Int. Cl.
| | |
|---|---|
| H03K 5/00 | (2006.01) |
| H03K 17/00 | (2006.01) |
| H03K 17/04 | (2006.01) |
| H03K 17/687 | (2006.01) |
| H02M 3/07 | (2006.01) |

(52) U.S. Cl.
USPC ............. 327/390; 327/91; 327/94; 327/97; 327/374; 327/434; 327/589

(58) Field of Classification Search
USPC ............. 327/374–377, 390, 434–437, 530, 327/538–540, 545, 546
See application file for complete search history.

(56) References Cited

U.S. PATENT DOCUMENTS

| | | | |
|---|---|---|---|
| 5,172,019 A | 12/1992 | Naylor et al. | |
| 5,682,050 A * | 10/1997 | Williams | 257/368 |
| 5,831,306 A | 11/1998 | Gardner et al. | |
| 6,060,937 A | 5/2000 | Singer et al. | |
| 6,072,355 A | 6/2000 | Bledsoe | |
| 6,215,348 B1 | 4/2001 | Steensgaard-Madsen | |
| 6,275,395 B1 | 8/2001 | Inn et al. | |
| 6,310,565 B1 | 10/2001 | Ong et al. | |
| 6,323,697 B1 | 11/2001 | Pavan | |
| 6,384,457 B2 | 5/2002 | Tyagi et al. | |
| 6,724,236 B1 | 4/2004 | Sarraj | |
| 6,956,411 B1 | 10/2005 | Holloway | |

(Continued)

OTHER PUBLICATIONS

Lee et al., "Two Fully Differential CMOS 1V Switched-Capacitor Amplifiers", 2007, IEEE Conference on Electrical Devices and Solid-State Circuits, pp. 893-896.*

*Primary Examiner* — Lincoln Donovan
*Assistant Examiner* — Colleen O Toole
(74) *Attorney, Agent, or Firm* — Patent Law Group LLP; Brian D. Ogonowsky (57) ABSTRACT

A switch circuit is described, where a switch to be controlled is formed of two NMOS transistors having their source terminals connected together and their gate terminals connected together. Their drain terminals are the input and output terminals of the switch. A driver circuit controls a bootstrap circuit that is formed of a latching circuit and a capacitor. When the switch is in an off state, the driver circuit connects the capacitor to a charging voltage source for charging the capacitor to a bootstrap voltage, and applies a non-zero voltage across the latching circuit. When the driver circuit is controlled to turn on the switch, the driver circuit disconnects the capacitor from the charging voltage source, and the latching circuit becomes conductive and effectively connects the capacitor across the gate and source terminals of the switch to turn it on with the bootstrap voltage. The bootstrap voltage across the capacitor maintains the latching circuit in a latched conductive state.

34 Claims, 4 Drawing Sheets

U.S. PATENT DOCUMENTS

| | | |
|---|---|---|
| 7,176,742 B2 | 2/2007 | Aksin et al. |
| 7,279,940 B1 | 10/2007 | Min |
| 7,385,440 B2 | 6/2008 | Aksin et al. |
| 7,397,284 B1 | 7/2008 | Liu |
| 7,710,164 B1 | 5/2010 | Sharma |
| 7,834,665 B2 | 11/2010 | Setterberg |
| 7,863,943 B2 | 1/2011 | Maes et al. |
| 2002/0021162 A1 | 2/2002 | Pinna et al. |
| 2003/0016070 A1 | 1/2003 | Yang |
| 2005/0127976 A1 | 6/2005 | Clara et al. |
| 2006/0192546 A1 | 8/2006 | Geelen |
| 2007/0046359 A1 | 3/2007 | Zanchi et al. |
| 2008/0309400 A1 | 12/2008 | van der Wagt |
| 2008/0315246 A1 | 12/2008 | Ueno et al. |
| 2010/0013541 A1 | 1/2010 | Balboni |
| 2011/0080205 A1 | 4/2011 | Lee |

\* cited by examiner

BOOTSTRAP TRANSISTOR CIRCUIT

CROSS-REFERENCE TO RELATED APPLICATIONS

This application is based on, and claims priority from, U.S. provisional application Ser. No. 61/141,787, filed on Dec. 31, 2008, entitled "High-Voltage Sampling Switch," by Jesper Steensgaard-Madsen, incorporated by reference.

FIELD OF THE INVENTION

This invention relates to switch circuits and, in particular, to a bootstrap transistor circuit, which, for turning on a MOSFET switch, applies a voltage to a gate terminal that has a substantially fixed voltage difference with respect to a source terminal. The invention is applicable to implementing switch circuits using various types of semiconductor devices, including MOSFETs.

BACKGROUND

An NMOS transistor can be turned on by applying to its gate terminal a voltage that is somewhat higher than a voltage applied to its source terminal. The gate-to-source voltage Vgs modulates the conductivity of the MOSFET's channel, which is formed between the drain and source terminals when Vgs exceeds a threshold voltage. Bootstrap circuits have been designed to provide MOSFET switches with a substantially constant conductivity by effectively inserting a voltage source (providing a bootstrap voltage) between the source and gate terminals of an NMOS transistor, when turning on the transistor. Such a bootstrap circuit may be used, for example, when the switch needs to operate with a relatively low supply voltage, or when it is important to preserve an analog waveform accurately from one side of a switch to the other.

Figure 1:
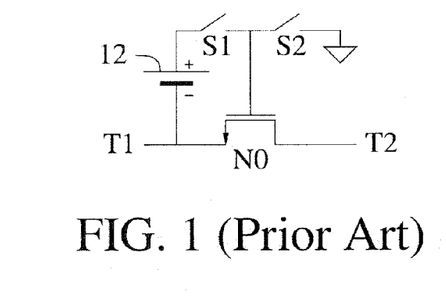
FIG. 1 is a schematic of a prior art switch and bootstrap circuit.

Prior art FIG. 1 illustrates an example of a bootstrap circuit. An NMOS transistor N0 has a source terminal T1 connected to a variable input voltage, and it has a drain terminal T2 providing an output voltage. For turning on N0, switch S1 is closed to cause a gate terminal to be applied a voltage that is substantially the input voltage at the source terminal T1 raised by a bootstrap voltage, provided by a voltage source 12. Since the bootstrap voltage is higher than a threshold voltage for N0, N0 turns on, and a substantially constant Vgs voltage for N0 ensures that the conductivity between terminals T1 and T2 is substantially independent of the input voltage applied to terminal T1. To turn N0 off, switch S1 is turned off and switch S2 is turned on to discharge the gate terminal to ground.

By maintaining a substantially constant voltage between two device terminals, a bootstrapped semiconductor may operate reliably as a switch for voltage signals that may swing in a voltage range wider than a reliability voltage limit for the semiconductor device. A reliability voltage limit is a limit for the voltages that may be applied between two designated device terminals. By exceeding any one of a semiconductor device's reliability voltage limits, the device may become damaged or be subject to an accelerated deterioration of its electrical properties. A gate-oxide breakdown voltage, for example, is a reliability voltage limit for a MOSFET device. A junction breakdown voltage is another example of a reliability voltage limit.

The maximum excursion of a voltage signal that may be applied to a traditional transmission-gate MOSFET switch, an NMOS and a PMOS connected in parallel, without exceeding a gate-oxide breakdown voltage, is substantially the same as the gate-oxide breakdown voltage. What is needed is a simple, small, and efficient switch circuit that can handle relatively high input voltages without exceeding reliability voltage limits. Such a switch circuit may be used advantageously in a wide range of signal-processing and power-management applications. Further, a symmetrical bootstrapped switch circuit is needed for use in analog applications, such as switched-capacitor circuits, including analog-to-digital and digital-to-analog converters, to reduce or prevent even-order distortion. Further, a bootstrapped circuit is needed to facilitate operation at low supply voltages.

SUMMARY

Various embodiments of a switch circuit are described for coupling an input voltage applied at an input terminal of a switch to an output terminal of the switch.

In one embodiment, a switch is formed by two NMOS transistors connected back-to-back. The source terminals of the NMOS transistors are connected in a shared source node, and the gate terminals are connected in a shared gate node. The NMOS transistors are asymmetrical, allowing higher voltages to be applied across the drain-source and drain-gate terminals than a reliability voltage limit allows for voltages applied across the gate-source terminals. For example, the transistors may be DMOS types and the drain may have a lightly doped drain extension to increase a breakdown voltage. The input and output voltages are only connected to the drain terminals of the back-to-back transistors. A bootstrapped operation of the switch maintains the gate-source voltage within a range allowed for the devices. Accordingly, without exceeding any reliability voltage limits, the circuit is able to switch voltage signals with a peak-to-peak excursion that may be wider than a gate-source reliability voltage limit for the NMOS transistors.

A latching circuit, formed of a PMOS transistor and an NMOS transistor, has a first terminal and a second terminal. The first terminal is connected to the shared gate node of the switch and the second terminal is connected to a positively-charged terminal of a bootstrap capacitor. A negatively-charged terminal of the bootstrap capacitor is connected to the shared source node of the switch. When the switch is in an off state, the bootstrap capacitor is charged via a driver circuit to a bootstrap voltage. The driver circuit also applies a predetermined non-zero voltage between the first and second terminals of the latching circuit. When the switch is in an on state, all connections to the driver circuit are in a high-impedance state, effectively disconnecting the switch, the latching circuit, and the bootstrap capacitor from the driver circuit, and the latching circuit is in a conductive state where it substantially equalizes the potentials of its first and second terminals. Accordingly, the latching circuit effectively connects the bootstrap capacitor between the shared gate node and the shared source node. The voltage across the bootstrap capacitor maintains the latching circuit in the conductive state. The bootstrap capacitor acts as a bootstrap voltage source to turn on the switch NMOS transistors as well as the PMOS and NMOS transistors comprised in the latching circuit. More specifically, the PMOS transistor in the latching circuit connects the charged bootstrap capacitor between the shared source node and the shared gate node of the switch to turn the switch on. The NMOS transistor in the latching circuit keeps the PMOS transistor on.

To turn the switch off, the driver circuit applies a low voltage potential to the shared gate node and to the shared source node. The driver circuit also applies a higher voltage potential to the positively-charged terminal of the bootstrap capacitor, thereby charging the bootstrap capacitor. By applying these voltages in the switch off state, the predetermined non-zero voltage is applied across the latching circuit, which effectively disconnects the bootstrap capacitor from the shared gate node.

BRIEF DESCRIPTION OF THE DRAWINGS

Elements that are the same or equivalent are labeled with the same numeral.

DETAILED DESCRIPTION

Figure 2:
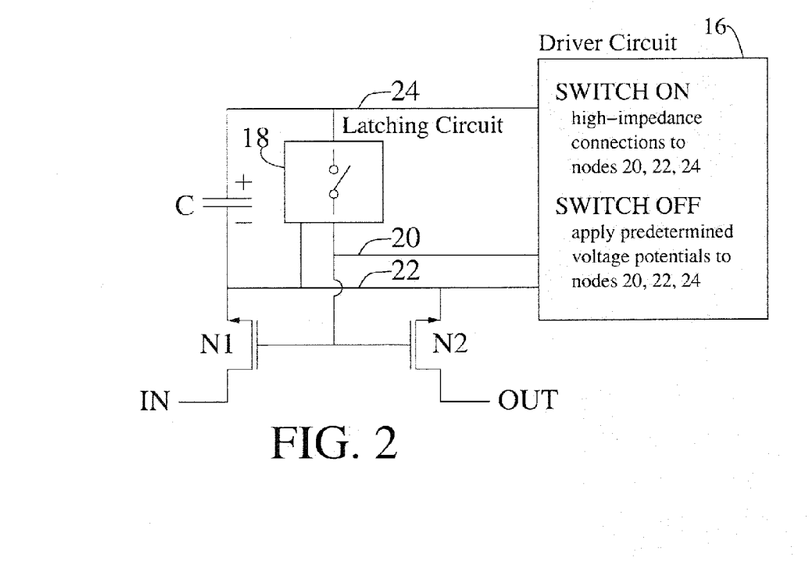
FIG. 2 is a simplified schematic diagram of one embodiment of the invention, which depicts a switch configuration, a bootstrap circuit, and a control scheme.

FIG. 2 illustrates one embodiment of the invention. There are many ways to implement the circuit of FIG. 2. The invention may be incorporated in an integrated circuit device that is used to switch an input pin to an output pin in response to a control signal applied to a control pin. The switch circuit in FIG. 2 may alternatively be part of a larger circuit, such as a power-management system, or an analog-to-digital converter that samples a varying analog signal.

In FIG. 2, the switch is created using two NMOS transistors N1 and N2 connected back-to-back. The source terminals of N1 and N2 are connected together in a shared source node 22, and the gate terminals of N1 and N2 are connected together in a shared gate node 20. The drain terminal of N1 is connected to an input voltage, and the drain terminal of N2 provides the switched output voltage. When the switch is on, there is only a very small voltage drop between the input and output terminals IN and OUT (nominally zero, for zero current flowing through the switch devices N1 and N2).

In one embodiment, N1 and N2 are asymmetrical, allowing higher voltages to be applied across the drain-source and drain-gate terminals than a reliability voltage limit may allow for voltages applied across the gate-source terminals. For example, the drain terminal may have a lightly doped drain extension. The drain extension may increase the drain-gate breakdown voltage considerably. Since the gate-source voltage for N1 and N2 is held below a predetermined maximum by the circuit, but the drain voltage is variable and potentially large, the gate-to-source breakdown voltage of N1 and N2 may not need to be as high as the drain-to-gate breakdown voltage.

Some examples of asymmetrical MOSFETs are described in U.S. Pat. Nos. 5,831,306 and 6,384,457, incorporated by reference. The use of asymmetrical transistors is optional. For example, the invention can advantageously be embodied in low-voltage circuits, wherein traditional low-voltage symmetrical semiconductor devices may be protected from stress beyond their reliability voltage limits. The use of silicon-on-insulator technologies may be advantageous to overcome limitations (including reliability voltage limits) associated with traditional junction-isolation used in many technologies.

A latching circuit 18 has a first terminal and a second terminal. The first terminal is connected to the shared gate node 20 and the second terminal is connected to a positively-charged terminal of a capacitor C at a node 24. A negatively-charged terminal of capacitor C is connected to the shared source node 22. When the N1/N2 switch is off, a driver circuit 16 drives nodes 20, 22, and 24 to predetermined voltage levels. By driving node 24 to a first predetermined voltage level higher than a second predetermined voltage level applied to node 22, capacitor C is charged via the driver circuit 16 to a predetermined bootstrap voltage. The top terminal of capacitor C connected to node 24 is charged to a more positive voltage than the bottom terminal of capacitor C, making it the positively-charged terminal. When the N1/N2 switch is off, the driver circuit 16 drives node 20 to a third predetermined voltage level, which is sufficiently low to ensure that N1 and N2 will remain off for input voltages within a predetermined input voltage range. The third predetermined voltage level may be substantially the same as the second predetermined voltage level, whereby Vgs for N1 and N2 is substantially zero when the N1/N2 switch is off. The latching circuit 18 may optionally have a third terminal connected to the shared source node 22, and the driver circuit 16 may optionally provide additional connections (not shown) to the latching circuit 18 to control the latching circuit 18.

When the N1/N2 switch is on, the driver circuit 16 provides only high-impedance connections to nodes 20, 22, and 24. The driver circuit 16 may load nodes 20, 22, and 24 (and any optional connections incorporated to control the latching circuit 18) capacitively, but the nominal (ideal) condition is that the N1/N2 switch, capacitor C, and latching circuit 18 collectively control the voltages on nodes 20, 22, and 24 independent of any substantial interaction with driver circuit 16. Accordingly, when the N1/N2 switch is on, the driver circuit 16 is nominally isolated from the N1/N2 switch, capacitor C, and latching circuit 18. When the N1/N2 switch is on, a conductive path is established from the input terminal IN to the output terminal OUT, the conductive path traversing the shared source node 22. Accordingly, the voltage on shared source node 22 is substantially the same as the input voltage. All node voltages in the latching circuit 18 will substantially track the input voltage applied to the input terminal IN of the N1/N2 switch, when on. All transistors in the latching circuit 18 may experience terminal-to-terminal voltages that are substantially limited by the voltage across capacitor C, the bootstrap voltage (including voltages across gate-oxides in the latching circuit).

When the N1/N2 switch is on, the latching circuit 18 equalizes the (voltage) potentials of nodes 20 and 24, thereby effectively connecting capacitor C between the shared source node 22 and the shared gate node 20. A fraction of the charge that was stored on capacitor C (when charged via the driver circuit 16 when the N1/N2 switch was off) is transferred via the latching circuit 18 to the gate terminals of N1/N2, whereby the gate-source voltage of N1/N2 becomes substantially the same as a residual voltage across capacitor C. The residual voltage across capacitor C may be smaller than the voltage that capacitor C was charged to via driver circuit 16 when the N1/N2 switch was off, but the residual voltage (the effective bootstrap voltage) exceeds the threshold voltage of N1/N2 and turns on the N1/N2 switch. The latching circuit 18 may be designed to consume only negligible static power when the N1/N2 switch is on. Accordingly, the effective bootstrap voltage across capacitor C may be maintained for a considerable period of time when the N1/N2 switch is on.

The process of toggling the N1/N2 switch to be on, i.e., facilitating an off-to-on transition for the N1/N2 switch, may include the step of driver circuit 16 injecting a charge pulse of a predetermined polarity to trigger the latching circuit 18 to latch in a conductive state. The latching circuit 18 may alternatively be designed to be self-latching, or latching circuit 18 may be caused to latch as part of the driver circuit 16 increasing the impedance of its connections to nodes 20, 22, and 24 (nominally disconnecting the driver circuit 16 from these nodes). The latching circuit 18 will equalize the potentials of nodes 20 and 24 when driver circuit 16 ceases to drive these nodes to the predetermined voltage levels. Once latched in the conductive state, latching circuit 18 may remain conductive without substantial interaction with driver circuit 16.

A very simple embodiment of this invention is realized by implementing the latching circuit 18 in FIG. 2 as a resistor connected between nodes 20 and 24 (the latching circuit 18 comprising only the resistor). When the N1/N2 switch is off, driver circuit 16 will establish and maintain a predefined voltage across the resistor. When driver circuit 16 increases the impedance of its connections to nodes 20, 22, and 24 (effectively isolating the driver circuit 16 from the switch), the resistor will equalize the potentials of nodes 20 and 24 by transferring charge from the positively-charged terminal of capacitor C to the gate terminals of N1 and N2, thereby turning on the N1/N2 switch. This embodiment may be used advantageously in any circuit and application for which static power consumption by the resistor is acceptable when the N1/N2 switch is off.

A switch circuit similar to that shown in FIG. 2 may be implemented with two PMOS transistors connected back-to-back as the switch and all polarities reversed. Furthermore, each embodiment may be modified to incorporate any type of semiconductor device for which the impedance of a conductive path may be modulated by a voltage applied between two terminals.

Figure 3:
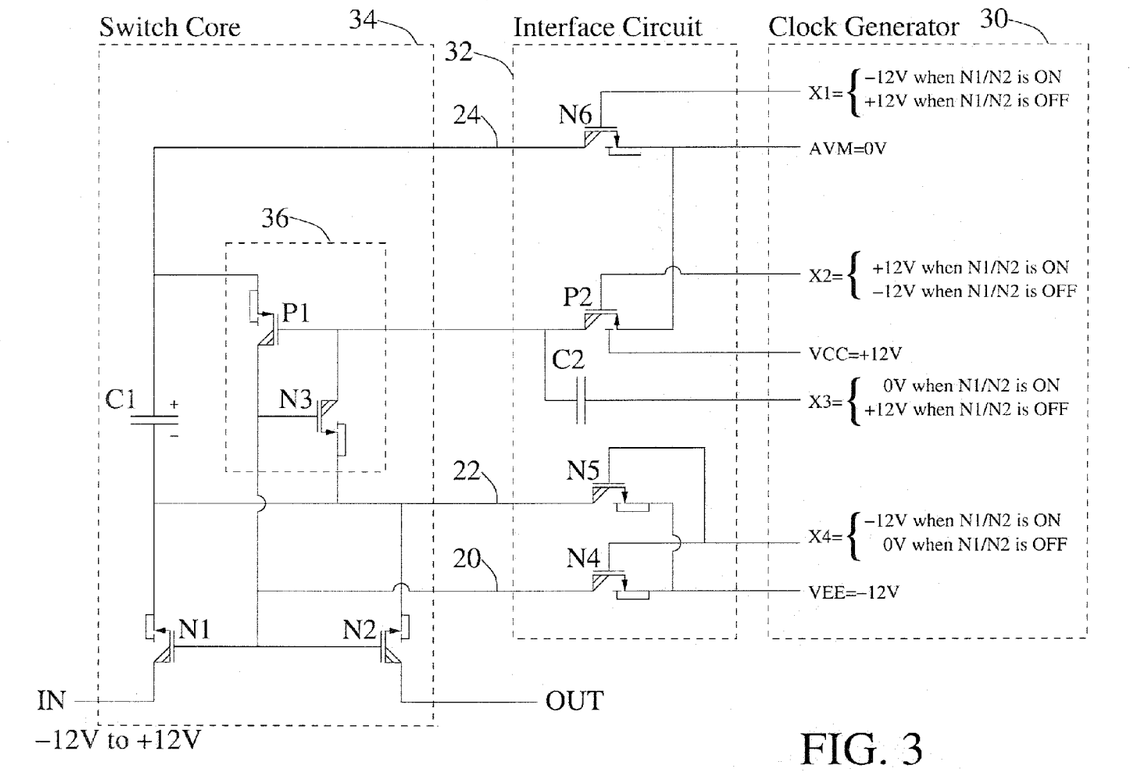
FIG. 3 is one embodiment of a circuit in accordance with the invention.

FIG. 3 illustrates one implementation of the circuit of FIG. 2. In FIG. 3, a clock generator 30 and an interface circuit 32 implement the driver circuit 16 of FIG. 2. The switch core 34 constitutes the remainder of the circuit in FIG. 2. The various transistors' body terminals are shown as being either connected to their source terminal or connected to a fixed bias voltage.

PMOS transistor P1 and NMOS transistor N3 implement a latching circuit 36 constituting the latching circuit 18 in FIG. 2. Capacitor C1 constitutes the capacitor C in FIG. 2. The switch itself is the combination of N1 and N2.

In the example of FIG. 3, all transistors may tolerate at least 12V across any two terminals. The transistors may be asymmetrical and they may tolerate at least 40V across the drain-gate and drain-source terminals. Asymmetry of the reliability voltage limits may be achieved by providing the drain region with a lightly doped extension, and this feature is conveyed in FIG. 3 by the cross-hatching at the drain side of the transistors. The transistors may be vertical or lateral types. The range of input voltages applied to the IN terminal of the N1/N2 switch is −12 volts to +12 volts.

The clock generator 30 provides control signals X1, X2, X3, and X4, which each toggle between two predetermined voltage levels. The voltage levels are shown in FIG. 3 where the "N1/N2 is OFF" levels identify the voltage levels the control signals have when the N1/N2 switch is off (i.e., not conductive). Likewise the "N1/N2 is ON" levels identify the voltage levels the control signals have when the N1/N2 switch is on (i.e., conductive). Various fixed power supply voltage levels (AVM, VCC, VEE) are also shown in FIG. 3.

When the N1/N2 switch is off, NMOS N6 provides a low-impedance connection between node 24 and AVM=0V, and NMOS N5 provides a low-impedance connection between node 22 and VEE=−12V. Accordingly, capacitor C1 is charged to AVM−VEE=+12V when the N1/N2 switch is off. Furthermore, NMOS N4 provides a low-impedance connection between node 20 and VEE=−12V, which ensures that the N1/N2 switch is substantially non-conductive with respect to the input voltage range from −12V to +12V. PMOS P2 provides a low-impedance connection between the gate terminal of PMOS P1 and AVM=0V, which ensures that P1 is off. The predetermined 0V and −12V voltage levels applied via low-impedance connections to each of the 4 circuit nodes within the switch core 34 will cause all MOSFETs (N1, N2, N3, and P1) in the switch core 34 to be substantially non-conductive. Accordingly, when the N1/N2 switch is off, the switch core 34 may consume very little static power, and capacitor C1 will be charged to +12V.

When the N1/N2 switch is to be closed (turned on), the clock generator 30 toggles control signals X1, X2, X3, and X4 to their "N1/N2 is ON" voltage levels. This will cause MOSFETs N4, N5, N6, and P2 to become substantially non-conductive, effectively isolating the switch core 34 from the driver circuit. A limited capacitive coupling C2 between the switch core 34 and the driver circuit is intentional and always present in this embodiment.

PMOS P1 and NMOS N3 form latching circuit 36, which provides a substantially conductive connection between node 24 and node 20 when the N1/N2 switch is on. When P1 is turned on, P1 connects capacitor C1 between the gate and source terminals of N3, whereby the bootstrap voltage across capacitor C1 will cause and maintain a substantially constant Vgs for N3, thus operating N3 as a bootstrapped switch. When N3 is turned on, N3 connects capacitor C1 across the source and gate terminals of P1, whereby the bootstrap voltage across capacitor C1 will cause and maintain a substantially constant Vgs for P1, thus operating P1 as a bootstrapped switch. The P1/N3 latching circuit 36 can be non-conductive (P1 and N3 both off) or conductive (P1 and N3 both on) while capacitor C1 is charged to the bootstrap voltage. The latching circuit 36 is non-conductive when the N1/N2 switch is off, and it is conductive when the N1/N2 switch is on. Capacitor C2 is used to trigger the P1/N3 latching circuit 36. A negative transition from +12V to 0V of control signal X3 in the transition from "N1/N2 is OFF" to "N1/N2 is ON" causes C2 to inject a negative charge pulse onto the gate of P1, which turns on P1, which then turns on N3. Capacitor C2 may be sized to control the amount of negative charge injected by the transition of control signal X3. Once the P1/N3 latching circuit 36 is triggered and made conductive, the effective bootstrap voltage across capacitor C1 will keep the P1/N3 latching circuit 36 in a latched conductive state until the driver circuit turns off the N1/N2 switch by toggling the X1, X2, X3, and X4 control signal to their "N1/N2 is OFF" voltage levels.

Various transistor-level implementations of the clock generator 30 may be used for providing the control signals X1, X2, X3, and X4 to the interface circuit 32. The design of a suitable clock generator 30 is well within the skills of those skilled in the art.

Figure 4:
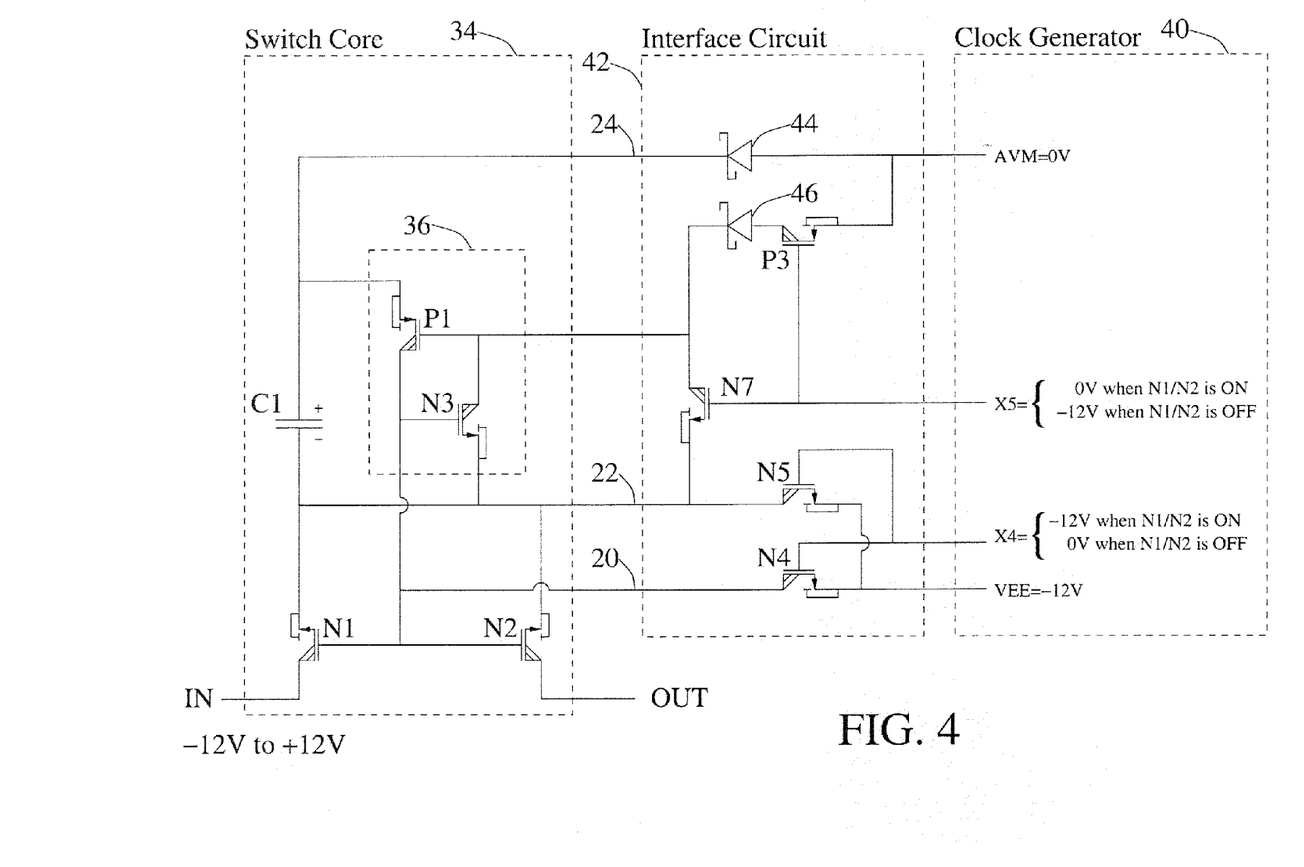
FIG. 4 is another embodiment of a circuit in accordance with the invention.

FIG. 4 illustrates another implementation of the circuit of FIG. 2. The switch core 34 is the same as that used in the implementation of FIG. 3, and described above. In FIG. 4, a clock generator 40 and an interface circuit 42 implement the driver circuit 16 of FIG. 2. Clock generator 40 provides control signal X4 and power supply voltages AVM=0V and VEE=−12V, also provided by clock generator 30 in FIG. 3. Clock generator 40 additionally provides a control signal X5, which is substantially the inverse of control signal X4. Specifically, control signal X5 has a voltage level of 0V when the N1/N2 switch in on, and a voltage level of −12V when the N1/N2 switch is off. It may be advantageous that the clock generator 40 needs to provide only two time-varying control signals (X4 and X5), as compared to the 4 time-varying control signals (X1, X2, X3, X4) provided by clock generator 30 in FIG. 3. Interface circuit 42 comprises NMOS transistors N4 and N5, which are also part of interface circuit 32 in FIG. 3. Interface circuit 42 also comprises Schottky diodes 44 and 46, PMOS transistor P3, and an NMOS transistor N7. The transistors shown in FIG. 4 may have the same electrical properties as the transistors used for the circuit in FIG. 3, discussed above. Specifically, the NMOS and PMOS transistors may be asymmetrical DMOS types.

When the clock generator 40 applies the voltage levels corresponding to "N1/N2 is OFF", control signal X4 will turn on N4 and N5, providing low-impedance connections from nodes 20 and 22 to VEE=−12V. The N1/N2 switch will thereby be turned off, as well as NMOS N3. Schottky diode 44 will charge capacitor C1 via N5 to a voltage that is substantially a diode-voltage-drop less than +12V. Control signal X5 will turn on PMOS P3 and turn off NMOS N7. When P3 is turned on, the gate-source voltage of PMOS P1 will be small, and P1 will be turned off. Accordingly, when the N1/N2 switch is off, the P1/N3 latching circuit 36 will be off and C1 will be charged to nearly +12V.

When clock generator 40 applies the voltage levels that correspond to "N1/N2 is ON", transistors N4, N5 and P3 will be turned off. Schottky diode 44 may become reverse-biased, and the switch core 34 will be substantially isolated from the driver circuit. Schottky diode 46 prevents P3 from conducting for high input voltages. NMOS N7 provides initiating conduction between two nodes within the switch core 34, which triggers the latching circuit 36 when the switch is toggled from the off state to the on state.

The implementation of FIG. 4 may be modified by substituting N7 with a resistor connected between the gate terminal of P1 and node 22. The resistor will cause the latching circuit 36 to latch automatically when the driver circuit isolates the switch core 34 by increasing the impedance of its connections to nodes 20, 22, and 24. The resistor may also be used as a substitute for both N3 and N7.

Figure 5:
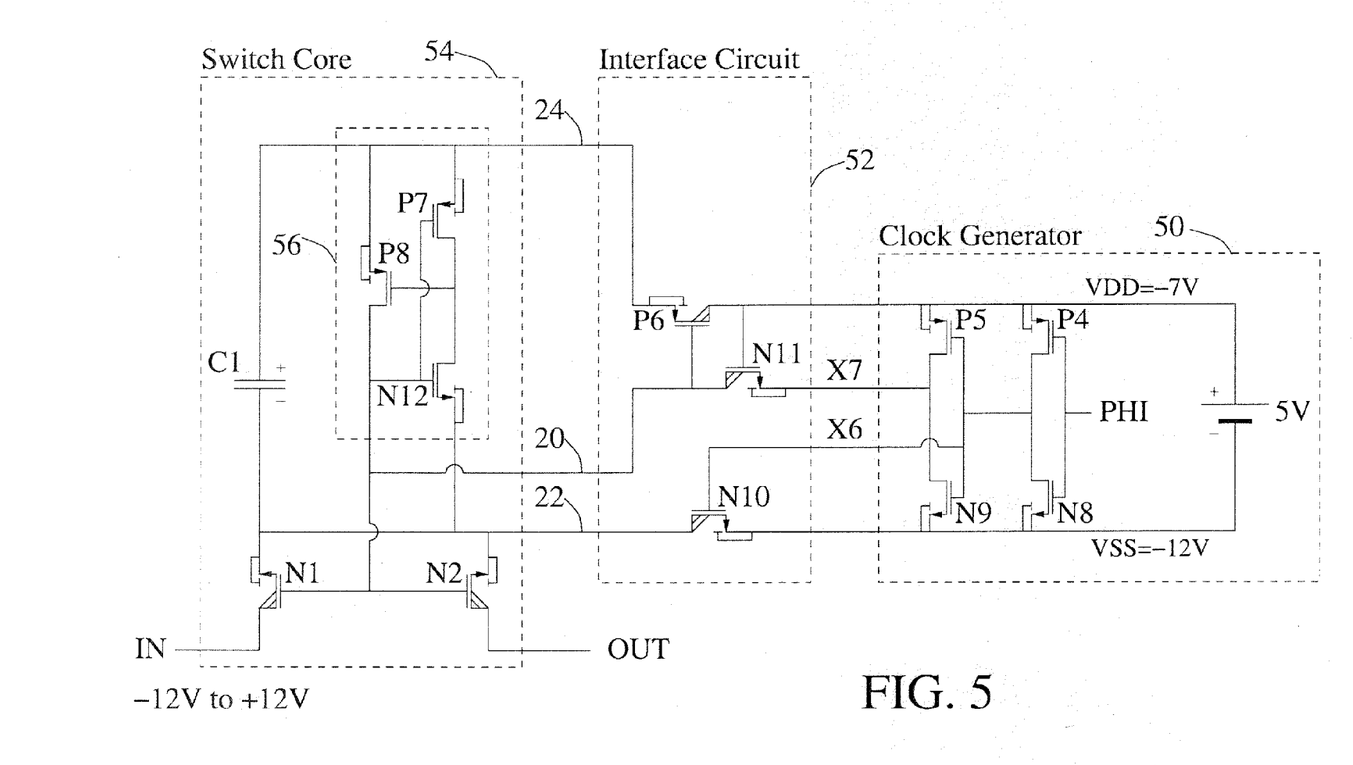
FIG. 5 is another embodiment of a circuit in accordance with the invention.

FIG. 5 illustrates another implementation of the circuit of FIG. 2. In FIG. 5, a clock generator 50 and an interface circuit 52 implement the driver circuit 16 of FIG. 2. A switch core 54 constitutes the remainder of the circuit in FIG. 2. The switch itself is implemented by NMOS transistors N1 and N2. NMOS transistor N12 and PMOS transistors P7 and P8 implement a latching circuit 56 constituting latching circuit 18 in FIG. 2. Clock generator 50 may be a 5V CMOS logic circuit, operating with respect to a low power rail VSS=−12V that corresponds to a logic-low voltage level, and a high power rail VDD=−7V that corresponds to a logic-high voltage level. The clock generator 50 is controlled by a 5V logic signal PHI, which is logic-high (VDD=−7V) to turn the N1/N2 switch on, and logic-low (VSS=−12V) to turn the N1/N2 switch off. The clock generator 50 provides two control signals, X6 and X7, which are respectively an inverted and a buffered representation of PHI. Control signal X6 is provided by an inverter circuit, implemented by NMOS N8 and PMOS P4, receiving PHI as its input. Control signal X7 is provided by another inverter circuit, implemented by NMOS N9 and PMOS P5, receiving X6 as its input.

When PHI is logic-low, X6 will be logic-high, which will turn on NMOS N10 in the interface circuit 52. When turned on, NMOS N10 provides a low-impedance connection between VSS=−12V and node 22. Furthermore, when PHI is logic-low, X7 will be logic-low, and NMOS N11 will be turned on. NMOS N11 is turned on because its gate terminal is connected to VDD=−7V, which is more than a threshold voltage higher than the voltage at its source terminal, which connected to VSS=−12V via NMOS N9. When turned on, N9 and N11 provide a low-impedance connection between VSS=−12V and node 20. Furthermore, PMOS P6 will be turned on because its gate terminal (node 20) is biased at approximately VSS=−12V, which is more than a threshold voltage below the voltage at its drain terminal, which is connected to VDD=−7V. When turned on, PMOS P6 provides a low-impedance connection between VDD=−7V and node 24. Accordingly, when PHI is logic-low, nodes 20 and 22 will be biased at approximately VSS=−12V, and node 24 will be biased at approximately VDD=−7V. Capacitor C1 is, therefore, nominally being charged to VDD−VSS=5V, and the N1/N2 switch will be off with respect to input signal voltages in the range from −12V to +12V applied to the input terminal IN. PMOS P7 and NMOS N12 in the latching circuit 56 form an inverter circuit coupled between the terminals of the charged capacitor C1. Node 20 is the input to the P7/N12 inverter, which is biased at substantially the same potential as the negatively-charged terminal of capacitor C1 when PHI is logic-low. Accordingly, P7 will be turned on, and N12 will be turned off. The output of the P7/N12 inverter is connected to the gate terminal of PMOS P8, which is turned off because its gate-source voltage is approximately 0V.

When PHI is logic-high, control signal X6 will be logic-low, which will turn off NMOS N10. Furthermore, when PHI is logic-high, control signal X7 will be logic-high. When X7 is logic-high (VDD=−7V), NMOS N11 and PMOS P6 will be conductive as long as node 20 is more than a threshold voltage below VDD=−7V. When conductive while X7 is logic-high, N11 and P6 will decrease the voltage between node 24 and node 20, which will cause the P7/N12 inverter to change state, which will latch the latching circuit 56 in a conductive state where it provides a substantially conductive connection between nodes 20 and 24. When the latching circuit 56 is latched in the conductive state, the potential at node 20 will be substantially the same as the potential at node 24, which is sufficiently high to turn off transistors P6 and N11 in the interface circuit 52. The P7/N12 inverter is powered by the charged capacitor C1, and the latching circuit 56 will remain in the latched conductive state for as long as capacitor C1 remains charged and PHI is logic-high.

The circuit in FIG. 5 may be implemented using only one type of MOSFET transistors, for example, asymmetrical DMOS devices. Some advantages may be achieved by implementing the circuit using two (or more) types of MOSFET transistors (if available), each type potentially providing both NMOS and PMOS devices. For example, high-voltage MOSFETs may be used for N1, N2, N10, N11, and P6, and low-voltage MOSFETs may be used to implement the clock generator 50 and the latching circuit 56. A high-voltage MOSFET may be symmetrical or asymmetrical. A high-voltage MOSFET may incorporate a gate-oxide that is thicker than a gate-oxide used to implement low-voltage MOSFETs on a shared semiconductor substrate. Alternatively, a distinction between high-voltage and low-voltage devices may reflect that only the high-voltage devices incorporate a drain extension; both types of devices may incorporate a gate-oxide of substantially the same thickness, and be implemented on the same semiconductor substrate. The circuit of FIG. 5 may, for example, be implemented using a technology providing only a 5V gate-oxide, i.e., a gate-oxide having a thickness suitable for 5V logic circuits. The high-voltage devices may, therefore, be subject to reliability voltage limits with respect to gate-source voltages that allow voltages only slightly higher than 5V, while the use of drain-extension or other manufacturing techniques may facilitate a much higher drain-gate breakdown voltage (reliability voltage limit) of, say, 30V. Low-voltage devices may be substantially smaller and faster than high-voltage devices, and it may be advantageous to use low-voltage devices, when it is possible to do so without exceeding any reliability voltage limits. When the invention is embodied in a low-voltage application, for example, a analog-to-digital converter with a 5V full-scale input range, all transistors in FIG. 5 may preferably be low-voltage symmetrical MOSFET devices. In some applications, the output terminal OUT in FIG. 5 may swing in a wide voltage range only during the on state of the switch, in which case it may be preferable to use a high-voltage semiconductor for N1 and a low-voltage semiconductor for N2. In many cases, however, it is preferable to use identical devices for N1 and N2, especially for applications where it is an objective to sample an analog signal with as little distortion as possible. The embodiment in FIG. 4 shows that diode junctions may be incorporated advantageously. The latching circuit of FIG. 5 may be combined with the interface circuit of FIG. 4 (eliminating diode 46 and PMOS P3) to implement a high-voltage bootstrapped switch circuit without using any high-voltage PMOS transistors. Further simplification can be achieved by incorporating resistors in the latching circuit.

Accordingly, numerous variations of the invention are anticipated, and the embodiments described herein are merely examples of several preferred embodiments. The best choice of circuitry and semiconductors to be used for the switch, the latching circuit, the interface circuit, and the clock generator depends on the specific application of the switch, the available types of semiconductors, reliability voltage limits, silicon area, cost, and many other factors and considerations typically involved in the design of an integrated circuit. Accordingly, while particular embodiments of the present invention have been shown and described, it will be obvious to those skilled in the art that changes and modifications may be made without departing from this invention in its broader aspects and, therefore, the appended claims are to encompass within their scope all such changes and modifications that are within the true spirit and scope of this invention.

What is claimed is:

1. A circuit comprising:
    a switch comprising a first MOSFET and a second MOSFET, a gate terminal of the first MOSFET being connected to a gate terminal of the second MOSFET, a source terminal of the first MOSFET being connected to a source terminal of the second MOSFET, a drain terminal of the first MOSFET being an input terminal of the switch, and a drain terminal of the second MOSFET being an output terminal of the switch;
    a driver circuit controlled by a clock generator; and
    a bootstrap circuit coupled to the driver circuit, the bootstrap circuit comprising:
        a capacitor selectively connected via switchable connectors in the driver circuit to a charging voltage source for charging the capacitor to a bootstrap voltage during an off state of the switch, the switchable connectors in the driver circuit being controlled by the clock generator;
        a latching circuit coupled to the capacitor and the switch, wherein, during an on state of the switch, the latching circuit is in a latched conductive state connecting the capacitor across the gate terminals and source terminals of the first MOSFET and second MOSFET,
        wherein the latching circuit comprises a first PMOS transistor and a first NMOS transistor, a gate terminal of the first PMOS transistor being connected to a drain terminal of the first NMOS transistor, a gate terminal of the first NMOS transistor being connected to a drain terminal of the first PMOS transistor, and wherein the capacitor is coupled between a source terminal of the first NMOS transistor and a source terminal of the first PMOS transistor,
        wherein the switchable connectors in the drive circuit are substantially non-conductive during the on state of the switch, whereby the latching circuit operates independently from the drive circuit during the on state of the switch to maintain the switch in its on state.

2. The circuit of claim 1 wherein the first MOSFET is asymmetrical having a gate-drain breakdown voltage higher than a gate-source breakdown voltage, and wherein the second MOSFET is asymmetrical having a gate-drain breakdown voltage higher than a gate-source breakdown voltage.

3. The circuit of claim 2 wherein the latching circuit comprises a symmetrical MOSFET transistor.

4. The circuit of claim 1 wherein the first MOSFET has a first reliability voltage limit with respect to voltages applied between its gate terminal and its source terminal and a second reliability voltage limit with respect to voltages applied between its gate terminal and its drain terminal; an absolute value of the second reliability voltage limit exceeding an absolute value of the first reliability voltage limit.

5. The circuit of claim 4 wherein a voltage signal is applied to the drain terminal of the first MOSFET, the applied voltage signal having a peak-to-peak excursion exceeding the first reliability voltage limit.

6. The circuit of claim 1 wherein the driver circuit comprises an asymmetrical MOSFET transistor having a gate-drain breakdown voltage higher than a gate-source breakdown voltage.

7. The circuit of claim 1 wherein the driver circuit contains transistors connected to the capacitor and the latching circuit, wherein the transistors are configured to disconnect the capacitor from the charging voltage source during the on state of the switch and establish a predetermined non-zero voltage across the latching circuit during the off state of the switch.

8. The circuit of claim 1 wherein the latching circuit comprises a bootstrapped semiconductor device.

9. The circuit of claim 1 wherein a conductivity of the latching circuit in the on state of the switch is substantially independent of a voltage potential on the source terminals of the first MOSFET and second MOSFET.

10. The circuit of claim 1 wherein the latching circuit further comprises a second PMOS transistor, a gate terminal of the second PMOS transistor being connected to the gate terminal of the first NMOS transistor, a source terminal of the second PMOS transistor being connected to the source terminal of the first PMOS transistor, and a drain terminal of the second PMOS transistor being connected to the drain terminal of the first NMOS transistor.

11. The circuit of claim 1 wherein the first MOSFET and the second MOSFET are NMOS transistors.

12. A circuit comprising:
    a switch comprising a first MOSFET and a second MOSFET, a gate terminal of the first MOSFET being connected to a gate terminal of the second MOSFET, a source terminal of the first MOSFET being connected to a source terminal of the second MOSFET, a drain terminal of the first MOSFET being an input terminal of the switch, and a drain terminal of the second MOSFET being an output terminal of the switch;
    a driver circuit controlled by a clock generator; and
    a bootstrap circuit coupled to the driver circuit, the bootstrap circuit comprising:
        a capacitor selectively connected via switchable connectors in the driver circuit to a charging voltage source for charging the capacitor to a bootstrap voltage during an off state of the switch, the switchable connectors in the driver circuit being controlled by the clock generator;

a latching circuit, connected to the driver circuit via switchable connectors in the drive circuit controlled by the clock generator, coupled to the capacitor and the switch, wherein, during an on state of the switch, the latching circuit is in a latched conductive state connecting the capacitor across the gate terminals and source terminals of the first MOSFET and second MOSFET, wherein the switchable connectors in the drive circuit are substantially non-conductive during the on state of the switch, whereby the latching circuit operates independently from the drive circuit during the on state of the switch to maintain the switch in its on state, wherein the driver circuit comprises:

a first switchable connector configured to apply a first predetermined voltage level to a first terminal of the capacitor in the off state of the switch;

a second switchable connector configured to apply a second predetermined voltage level to the source terminals of the first MOSFET and second MOSFET in the off state of the switch; and a third switchable connector configured to apply a third predetermined voltage level to the gate terminals of the first MOSFET and second MOSFET in the off state of the switch.

13. The circuit of claim 12 wherein a gate terminal of the third switchable connector is biased at the first predetermined voltage level.

14. The circuit of claim 1 further comprising a subcircuit to inject a charge pulse to cause the latching circuit to latch in the latched conductive state.

15. The circuit of claim 1 wherein the first MOSFET and second MOSFET are asymmetrical semiconductor devices comprising a gate oxide having a thickness that is substantially the same as a thickness of a gate oxide used to implement symmetrical semiconductor devices on a shared substrate.

16. A method of controlling a switch, the switch comprising a first MOSFET and a second MOSFET, a gate terminal of the first MOSFET being connected to a gate terminal of the second MOSFET, a source terminal of the first MOSFET being connected to a source terminal of the second MOSFET, a drain terminal of the first MOSFET being an input terminal of the switch, and a drain terminal of the second MOSFET being an output terminal of the switch, the method comprising the steps of:

in an off state of the switch, charging a capacitor, the capacitor having a first terminal and a second terminal coupled across a charging voltage source via switchable connectors in the driver circuit for charging the capacitor to a bootstrap voltage during the off state of the switch, the switchable connectors in the drive circuit being controlled by a clock generator;

in the off state of the switch, applying a non-zero voltage across a latching circuit via switchable connectors in the driver circuit, the latching circuit being coupled between the first terminal of the capacitor and the gate terminals of the first MOSFET and second MOSFET; and toggling the switch to be in an on state by controlling the switchable connectors in the driver circuit to be substantially non-conductive to disconnect the first terminal of the capacitor from the charging voltage source, and causing the latching circuit to latch to couple the first terminal of the capacitor to the gate terminals of the first MOSFET and second MOSFET to provide a bootstrap voltage between the gate and source terminals of the first MOSFET and second MOSFET, wherein the steps of charging the capacitor and toggling the switch to be in its on state comprises the steps of:

controlling a first switchable connector in the driver circuit connected between the first terminal of the capacitor and the charging voltage source for charging the capacitor during the off state of the switch;

controlling a second switchable connector in the driver circuit connected to the latching circuit for applying the non-zero voltage across the latching circuit during the off state of the switch; and controlling a third switchable connector in the driver circuit for applying a substantially fixed potential to the gate terminals of the first MOSFET and the second MOSFET during the off state of the switch, whereby the latching circuit operates independently from the drive circuit during the on state of the switch to maintain the switch in its on state.

17. The method of claim 16 wherein the non-zero voltage applied across the latching circuit in the off state of the switch is substantially the highest static voltage difference that occurs across any gate oxide that is a part of a semiconductor device used to implement the latching circuit.

18. The method of claim 16 further comprising the step of, during the on state of the switch, maintaining tracking voltage potentials on each side of a gate oxide embodied in the latching circuit, each of the tracking voltage potentials having a substantially constant voltage difference with respect to the source terminals of the first MOSFET and second MOSFET.

19. The method of claim 16 wherein the latching circuit comprises a bootstrapped switch.

20. The method of claim 16 wherein the latching circuit comprises a circuit element, which in the on state provides a conductive path between the first terminal of the capacitor and the gate terminals of the first MOSFET and second MOSFET; an impedance of the conductive path being substantially independent of a voltage potential on source terminals of the first MOSFET and second MOSFET.

21. The method of claim 16 wherein the first MOSFET semiconductor device is an asymmetrical MOSFET semiconductor device having a gate-drain breakdown voltage higher than a gate-source breakdown voltage.

22. The method of claim 16 wherein the latching circuit comprises a first PMOS transistor and a first NMOS transistor, a gate terminal of the first PMOS transistor being coupled to a drain terminal of the first NMOS transistor, a gate terminal of the first NMOS transistor being coupled to a drain terminal of the first PMOS transistor; the capacitor being connected between a source terminal of the first NMOS transistor and a source terminal of the first PMOS transistor.

23. The method of claim 16 wherein the driver circuit provides a switchable connection via a diode junction between the charging voltage source and the first terminal of the capacitor.

24. A circuit configured to provide a switchable conductive path between a switch input terminal and a switch output terminal in response to a logic signal for selecting an on state or an off state, the circuit comprising:

a switch comprising a first semiconductor device having a first terminal coupled to a first node and a second semiconductor device having a second terminal coupled to the first node, the switch configured to provide the switchable conductive path from the switch input terminal, traversing the first node, to the switch output terminal, wherein all current flowing between the switch input terminal and the switch output terminal flows through the first node, wherein the switch input terminal is a third terminal of the first semiconductor device, wherein the switch output terminal is a fourth terminal of the second semiconductor device, and wherein the conductive path is through both the first semiconductor device and the second semiconductor device to create the conductive path between the switch input terminal and the switch output terminal, the switch having a switch control terminal for controlling an electrical property of the switchable conductive path;

a capacitor coupled to the first node and to a second node;

a latching circuit coupled to the second node and to the switch control terminal; and a driver circuit configured to apply predefined voltage potentials to the switch control terminal, to the first node, and to the second node when the logic signal selects the off state of the switchable conductive path between the switch input terminal and the switch output terminal, wherein a path coupling the capacitor to the first node is substantially conductive for any state of the logic signal.

25. The circuit of claim 24 wherein a terminal of the capacitor is connected directly to the first node.

26. The circuit of claim 24 wherein the switch comprises two MOSFET transistors of a first polarity.

27. The circuit of claim 24 wherein the switch comprises two asymmetrical MOSFET transistors of a first polarity.

28. The circuit of claim 24 wherein the driver circuit is substantially isolated from the switch during the on state.

29. The circuit of claim 24 wherein the driver circuit comprises a plurality of switchable connections to the first node, to the second node, and to the switch control terminal, the plurality of switchable connections being substantially non-conductive during the on state.

30. The circuit of claim 24 wherein the latching circuit is configured to be self-latching, providing a conductive path between the second node and the switch control terminal during the on state.

31. The circuit of claim 24 wherein the latching circuit provides a continuously conductive path from the second node to the switch control terminal for any state of the logic signal.

32. The circuit of claim 24 wherein the latching circuit comprises a first PMOS transistor and a first NMOS transistor, a gate terminal of the first PMOS transistor coupled to a drain terminal of the first NMOS transistor, a gate terminal of the first NMOS transistor coupled to a drain terminal of the first PMOS transistor, the capacitor being coupled between a source terminal of the first NMOS transistor and a source terminal of the first PMOS transistor.

33. The circuit of claim 32 wherein the latching circuit further comprises a second PMOS transistor, a gate terminal of the second PMOS transistor coupled to the gate terminal of the first NMOS transistor, a source terminal of the second PMOS transistor coupled to the source terminal of the first PMOS transistor, and a drain terminal of the second PMOS transistor coupled to the drain terminal of the first NMOS transistor.

34. The circuit of claim 24 wherein the latching circuit comprises a bootstrapped semiconductor device.

\* \* \* \* \*